United States Patent [19]

Warner

[11] Patent Number: 4,644,341
[45] Date of Patent: Feb. 17, 1987

[54] CONTRAST INDICATING ARRANGEMENT IN PHOTOELECTRIC SENSING SYSTEMS

[75] Inventor: Robert A. Warner, Clearwater, Fla.

[73] Assignee: Tri-Tronics Company, Inc., Tampa, Fla.

[21] Appl. No.: 627,853

[22] Filed: Jul. 5, 1984

[51] Int. Cl.$^4$ .............................................. G09G 3/00
[52] U.S. Cl. .................... 340/753; 340/707; 340/815.31; 356/228
[58] Field of Search ........... 356/226, 227, 228; 340/707, 815.31, 753, 754

[56] References Cited

U.S. PATENT DOCUMENTS

| | | | |
|---|---|---|---|
| 2,450,319 | 9/1948 | Weisglas | 356/228 |
| 3,487,263 | 12/1969 | Pahlauan | 340/753 |
| 3,506,352 | 4/1970 | Denner | 356/228 |
| 3,898,636 | 8/1975 | Smith | 340/707 |

FOREIGN PATENT DOCUMENTS 0036934 3/1977 Japan ....................... 340/365 P

Primary Examiner—Marshall M. Curtis
Attorney, Agent, or Firm—Keil & Weinkauf

[57] ABSTRACT

A photoelectric sensing system, the adjustment of which is facilitated by the incorporation therein of a contrast indicator with a display in the form of an array of light emitting diodes (LEDs) controlled by a driver circuit which is arranged for successive illumination of the LEDs, preferably on a one-to-one basis. This bargraph type instrument is also effective in photoelectric sensing tasks involving variations of the detected light between "light" and "dark" at a rapid rate, in which case the range of LEDs between these two extremes appears dimly lit at a steady glow.

10 Claims, 6 Drawing Figures

CONTRAST INDICATING ARRANGEMENT IN PHOTOELECTRIC SENSING SYSTEMS

BACKGROUND AND SUMMARY OF THE INVENTION

This invention relates to photoelectric sensing systems, as well as the photoelectric sensing units proper, and it relates more particularly to the provision of means for facilitating the adjustment of such systems or units. The invention provides for this purpose a contrast indicating arrangement and makes use of an instrument which gives a visual indication of the light level returned to the sensing unit as detected in the "light" state and the light level returned to the detector in the "dark" state. The difference between the maximum or "light" reading of the instrument and the minimum or "dark" reading of the instrument, thus is the contrast differential; by the same token the ratio between these two readings is the contrast ratio.

More specifically, the instrument proposed by the invention as the contrast indicator for use in photoelectric sensing systems is a bargraph instrument, that is an instrument of a type which in the last few years has made its appearance as a signal strength indicator or readout device in a number of applications such as radio receivers, tape recorders, automobile dashboard instruments, light meters in cameras and the like. The bargraph instrument consists essentially of a display arrangement in the form of an array of light emitting means such as LEDs (light emitting diodes) and an electronic control or driver circuit for this display. With the aid of this driver circuit the LEDs are incrementally illuminated—individually or cumulatively depending on the option chosen—in instantaneous response to variations, that is increases or decreases, in the input voltage to the instrument. Thus, if the LEDs are successively illuminated in increments of, say, one volt, the level of the input voltage in volts can be read off the instrument by simply observing which particular one in the array of LEDs or what total number of consecutive LEDs has been lit; and in the combination in which the bargraph instrument is used according to the invention, both a "light" reading and a "dark" reading can be obtained in this manner and thus the contrast between light and dark can be quantitatively determined at a glance during the operation of the system. The determination of the contrast is important in photoelectric sensing because the proper adjustment of the system is substantially facilitated by this determination.

An example is the case where a continuous flow of objects on a conveyor passing the photoelectric sensor is to be monitored, for instance for the purpose of counting the objects. In this application—which is only one of a large number of such instances—, as one after the other of the objects detected by the sensor breaks or makes the light beam, the reading of the LED display of the bargraph instrument will fluctuate between the "light" level and the "dark" level, and in this manner the contrast differential, that is the light range actually available in the detecting operation can be dynamically observed by direct readout, and the scanning or sensing system can be adjusted accordingly.

A precise adjustment of the photoelectric sensing system is of particular importance where the differential between "light" and "dark" is very small so that both the extent and the absolute level of the critically narrow range can be accurately determined. One such case for example is a system for use with an automatic envelope stuffing machine, which is called upon to photoelectrically detect whether, say, one or more papers of the same kind, such as bills, have been dropped in the same envelope by the machine.

Another such example is where it has to be photoelectrically determined whether a certain thin washer which may be only a few thousandths of an inch thick has, in fact, been placed on a potentiometer shaft in assembly—in spite of the aggravating circumstance that on the fully assembled shaft a white nylon area is present just below the washer. While the use of fiberoptics—in this example as well as in the immediately preceding one—is of some assistance in the solution of the problem, without resort to the invention it is extremely difficult to detect in this case the minute difference between the amount of light coming off the washer when it is indeed in place on the shaft, and the level of light which comes off the aforementioned white area when the washer itself is in fact not in place.

Another and most illustrative example for the great usefulness of the invention is the photoelectric detection of high motor speeds, usually for the purpose of directly controlling this speed. This photoelectric detection can be carried out by directing a beam of light at the end of the motor shaft having a flat area formed thereon, by means of which a pulley or the like can be mounted in the actual use of the motor. Since the light reflected by the flat area is different from the light reflected by the remainder of the periphery of the shaft end, the analog signal derived from the detected light signal of the photoelectric system will fluctuate at a very rapid rate, namely that corresponding to the rotational speed, say 500 revolutions per second, of the motor. The fluctuations are so fast that the human eye cannot follow them.

A conventional electromechanical volt meter, too, because of its inertia could not be used to give an indication of the difference in level of the returned light as between the two situations in question (cylindrical shaft surface on the one hand and the flat area on the other): The needle of a conventional volt meter would merely settle at a nominal but meaningless reading without permitting any conclusions with respect to the light range that can actually be utilized. A digital volt meter would not work either. In a conventional digital volt meter the voltage is sampled for a certain length of time and then displayed but the times involved are not long enough to allow the sampling and displaying to be done in anything like a 500ths of a second.

The bargraph type contrast indicator in the system according to the invention does make a reading of the two extreme conditions in question possible even though the shaft speed is of the high order of magnitude mentioned. What happens in this case is that because of the light fluctuations occurring in the range between the maximum light reading (say 8 volts) and the minimum light reading (say 4 volts) the LEDs in this 4-volt range therebetween appear to the eye to be dimly lit at a steady glow.

Therefore, notwithstanding the high rotational speed of the motor and thus the high rate of change in output of the sensor system between "light" and "dark", the contrast indicator according to the invention gives the user an indication of the width of the voltage range he has to work with (8−4=4 volts) which in this instance is enough to safely allow for drift, that is a change of parameters during operation; and also an indication at what level this range is located. In the present instance the midpoint (6 volts) of this range roughly coincides with the midpoint (5.5 volts) of the scale of the instrument, assuming an instrument having a 10-volt scale is used. If it does not, the controls of the DC amplifier of the sensor system, particularly its bias ("offset") control can be adjusted to relocate, that is to center, the level of the range correspondingly.

This is especially desirable if the sensor system is designed for digital operation, that is arranged to produce a switching signal when the analog voltage reaches a certain selected level. In this instance the switching point is preferably set to a level slightly above 5 volts—the midscale point of the instrument.

From the foregoing general description it will be clear that with the contrast indicator according to the invention the available "light/dark" contrast, that is the contrast differential, can be ascertained at a glance regardless of the rapidity with which the detected light changes between the two extremes, and that as a result the user is enabled to present the—preferably proportional—analog DC signal developed by the sensor system at the most desirable level, and he is also enabled to determine the feasibility of the sensing task at hand and thereby eliminate marginal performance.

In addition, the contrast indicator of the invention can also be applied by the user to physically, i.e., optically align the photoelectric sensing system with great sensitivity. In this connection it may be mentioned that alignment indicators for photoelectric sensors are known per se. U.S. Pat. No. 4,356,393 to Fayfield, for example, discloses such an alignment indicating apparatus in which a repetitive alignment indicating signal is produced whose frequency is a function of the intensity of the received light signal. The indicator itself is in the form of a light-emitting diode so that this LED flashes at a rate indicative of the degree of alignment of the sensing system. While rough alignment of the optical system is possible in this manner, the flashing-rate type of indication does not lend itself to the determination of the "light/dark" contrast in operation and, of course, is unusable for such a determination in situations where the changes between "light and dark" detection occur at a rate too high to be followed by the human eye.

BRIEF DESCRIPTION OF THE DRAWINGS

Preferred embodiments of the invention will now be described in greater detail with reference to the accompanying drawings, in which.

DETAILED DESCRIPTION OF THE PREFERRED EMBODIMENTS

Figure 1:
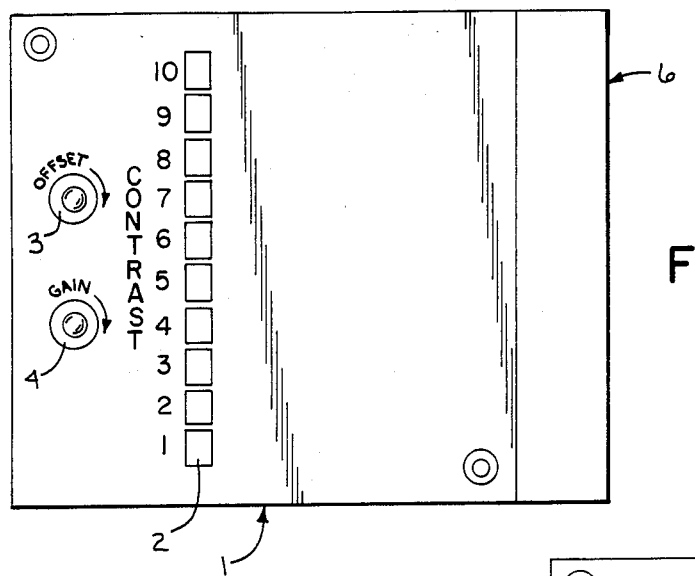
FIG. 1 is the front view of an analog scanner unit according to the invention having a bargraph instrument incorporated therein.
Figure 2:
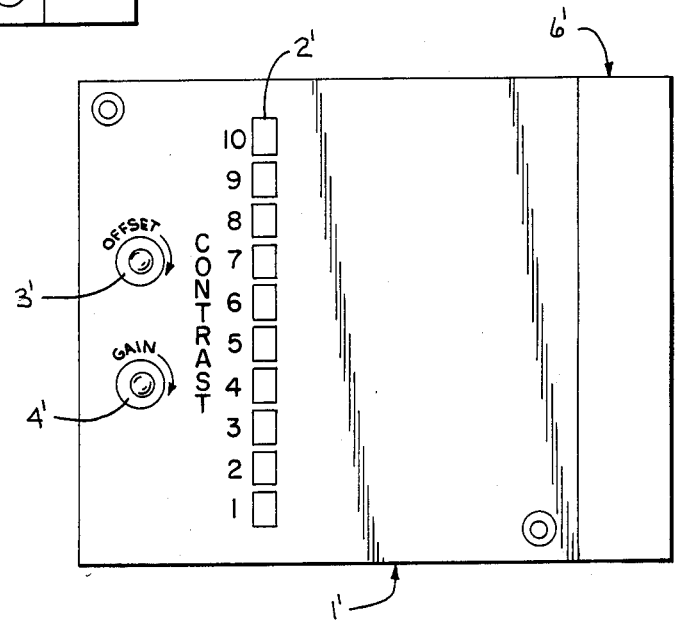
FIG. 2 is the front view of a digital scanner unit according to the invention having a bargraph instrument incorporated therein.

As will be seen from FIGS. 1 and 2, the sensing unit according to the invention can be implemented as an analog unit (FIG. 1) or a digital unit (FIG. 2). In both embodiments the bargraph type contrast indicator 2 (2') is built right into the sensor unit 1 (1'), that is in both embodiments of the invention the contrast indicator is available immediately at the sensing site, right next to the controls 3,4 (3', 4'). In the embodiment shown these controls are assumed to be screwdriver type controls but control knobs or the like could of course be used just as well. In the case of the analog version, FIG. 1, the manual controls are in the form of an offset (bias) control 3 and a gain control 4 for the DC amplifier. In the digital version the gain is permanently adjusted, in the unit itself, to its desired value, without being brought out as a variable control since, if switching at a particular selected point is to be provided, maximum gain is desired as a rule; on the other hand, the digital version, FIG. 2, is equipped with an LED 3' (not shown in the block diagram, FIG. 4) which indicates to the user when switching takes place. As will be noted from the block diagram, FIG. 4, the principal difference between the two embodiments is that in the digital version a voltage comparator 25 has been added in which the analog output (not separately brought out to a termination in this instance) is compared with a reference voltage to cause a digital or switching signal to be generated at the exact reference point.

Figure 4:
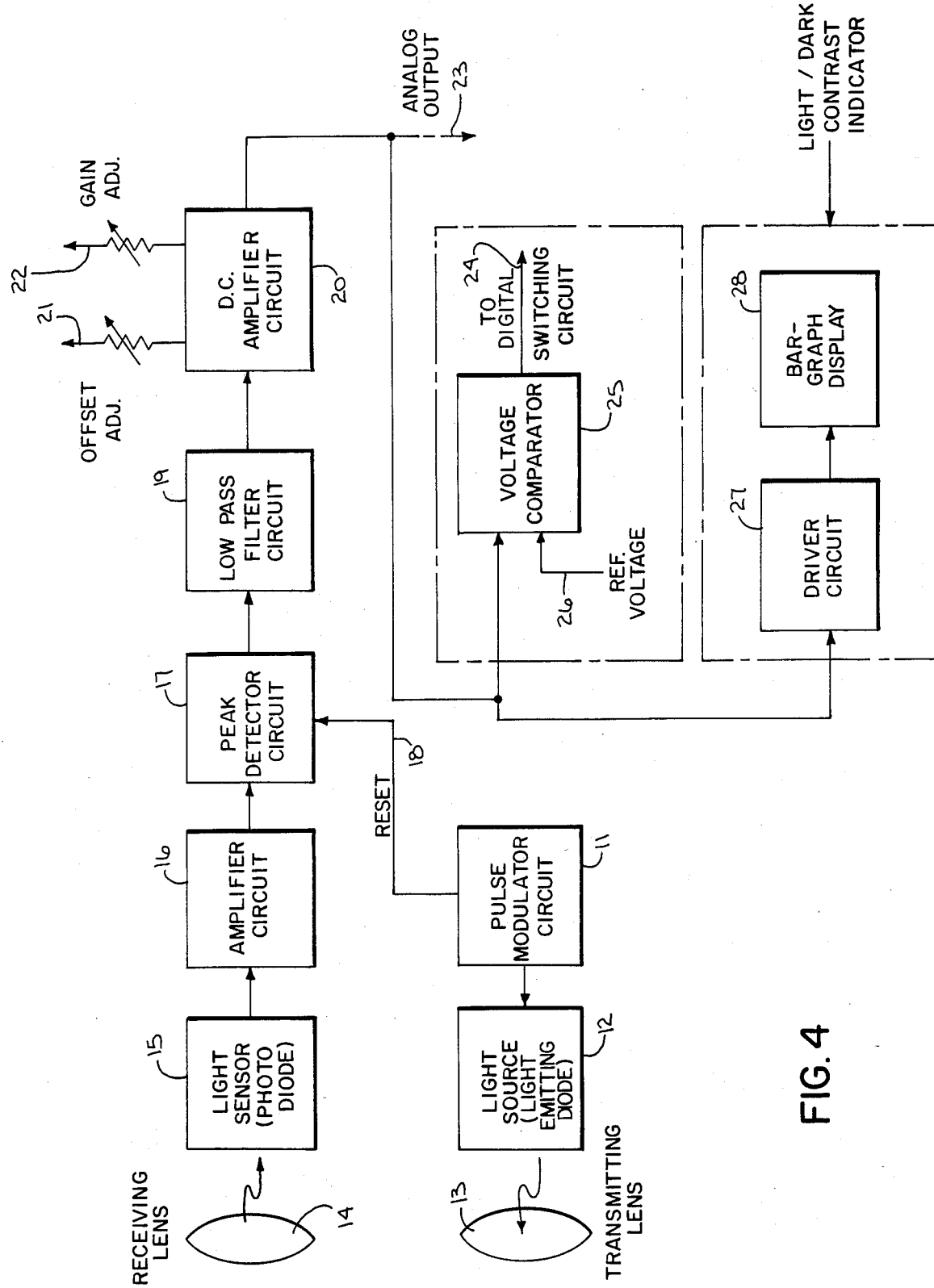
FIG. 4 is a block diagram of the circuit of the scanner of FIGS. 1 and 2.

As will further be seen from block diagram, FIG. 4, in both embodiments the unit does not only house the receiving portion but also the transmitting portion of the photoelectric system, the transmitting light source proper being in the form of an LED which, in a manner known per se, is powered through a modulator operating at a high frequency, say about 12 kc. A corresponding demodulator or detector is provided in the receiving portion of the sensor unit. This modulation and demodulation of the light beam substantially eliminates the effect of ambient light.

Actually the unit is assumed to be optionally provided with three different optical blocks 6 (6') for transmitting and receiving the light. These blocks or subassemblies are detachably and thus interchangeably mounted, by means of screws 8 on the unit as most clearly visible in FIG. 3. The three available optical blocks are:

1. For "optical proximity" sensing—a "beam making" mode in which the light emitted by the transmitter is reflected or diffused by the object itself and the light thus returned is sensed by the receiver;
2. For "retroreflective" sensing which is a "beam breaking" mode in which the beam is directed at a highly reflective target and returned to the receiver, the beam being broken by the object to be detected;
3. For "fiberoptics" sensing, a mode wherein a narrow beam of collimated light is conducted, by means of light wave guides, right to the location of the object and thence to the receiver. A differential light wave guide 7, known per se, has been indicated as attached to the corresponding fiberoptics block 6 in FIG. 3.

Referring now more particularly to block diagram, FIG. 4, the details of which are implemented by solid state components, the transmitting portion of the scanner or sensor unit consists of the light source 12 in the form of a light emitting diode, the light generated by this diode being modulated at a high frequency of, for example 12 kc, by modulator circuit 11 so as to substantially eliminate the effect of ambient light in the photoelectric sensing system. The transmitting lens 13 and the receiving lens 14 are part of the optical block 6 or 6' shown in FIGS. 1 to 3. As mentioned above, these optical blocks can be interchangeably provided for optical proximity sensing, retroreflective sensing and fiberoptics sensing.

The light returned under the control of the objects being sensed is focused by lens 14 on the light sensor 15 proper which is assumed herein to be a photodiode. The output of photodiode 15, upon amplification in amplifier 16, is demodulated in peak detector 17 which, as shown, also has a reset input 18 from modulator 11 of the transmitting portion. In low pass filter 19 the high frequency components of the detector output are eliminated and the remainder is impressed on DC amplifier 20 at the output of which the analog output of the system appears in amplified form. The gain of DC amplifier 20 is set by variable means schematically indicated in FIG. 3 by variable resistor 22 which, in turn, is adjustable, in the case of the analog version of the sensing unit, by the manual screwdriver type adjustment 4, FIG. 1. By the same token, the bias of the amplifier is settable by a variable means indicated in the figure by variable resistor 21 which is manually adjustable by screwdriver adjustment 3, FIG. 1, or 3', FIG. 2. Preferably the circuit functions in such a way that this DC analog output is directly proportional to the intensity of the received light.

Figure 3:
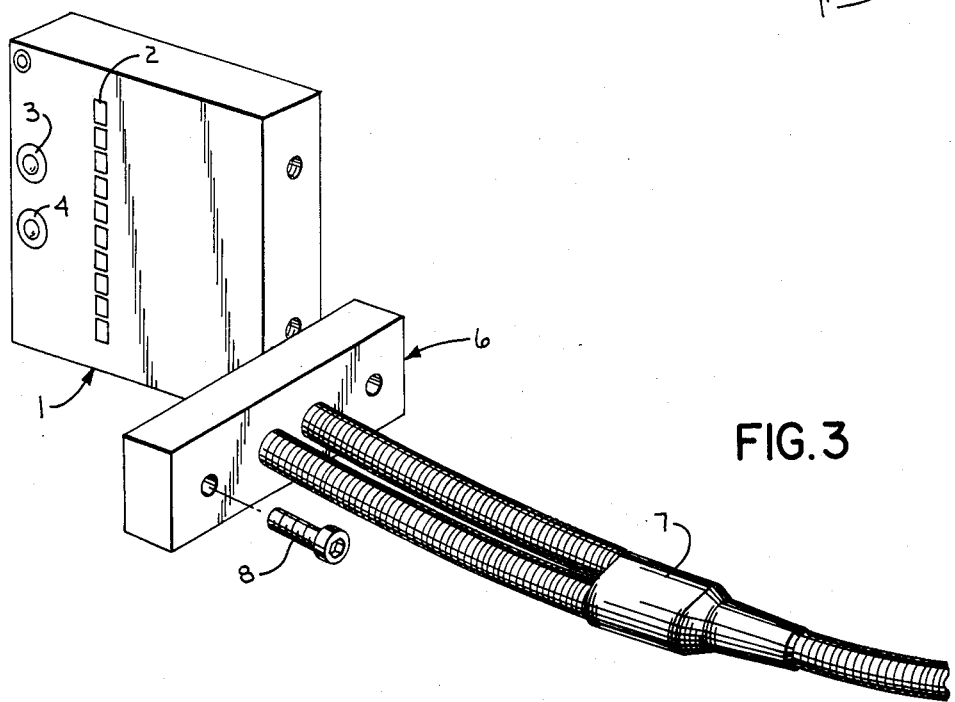
FIG. 3 is a perspective view of the scanner shown in FIG. 1 with a fiberoptics type subassembly which is shown in this figure detached from the scanner unit proper.

In the analog version, FIG. 1, this analog output voltage is brought out at a termination 23, FIG. 4, and thus becomes available for any analog control purpose which may be desired in a given application. In the digital version, FIG. 2 such a separate termination for the analog voltage is not required. Instead, in the digital embodiment the analog output is internally connected to the principal input of a voltage comparator 25 whereas the reference input 26 of this comparator is connected to a reference voltage which may be set at any desired value. In this fashion a digital output may be produced by the voltage comparator the moment the analog output reaches any given threshold level. As indicated in FIG. 3, the digital output may be impressed on a digital switching circuit suitable for the particular switching application at hand.

In both the analog version, FIG. 1, and the digital version, FIG. 2, the analog voltage is impressed on the control or driver circuit 27 of the bargraph display which in FIG. 4 has been indicated by the block 28 but corresponds as to its outward appearance to the display 2, FIG. 1, or 2', FIG. 2, thereby to give an indication of the available light contrast to the user and thereby facilitate the abovementioned manual adjustments.

Figure 5:
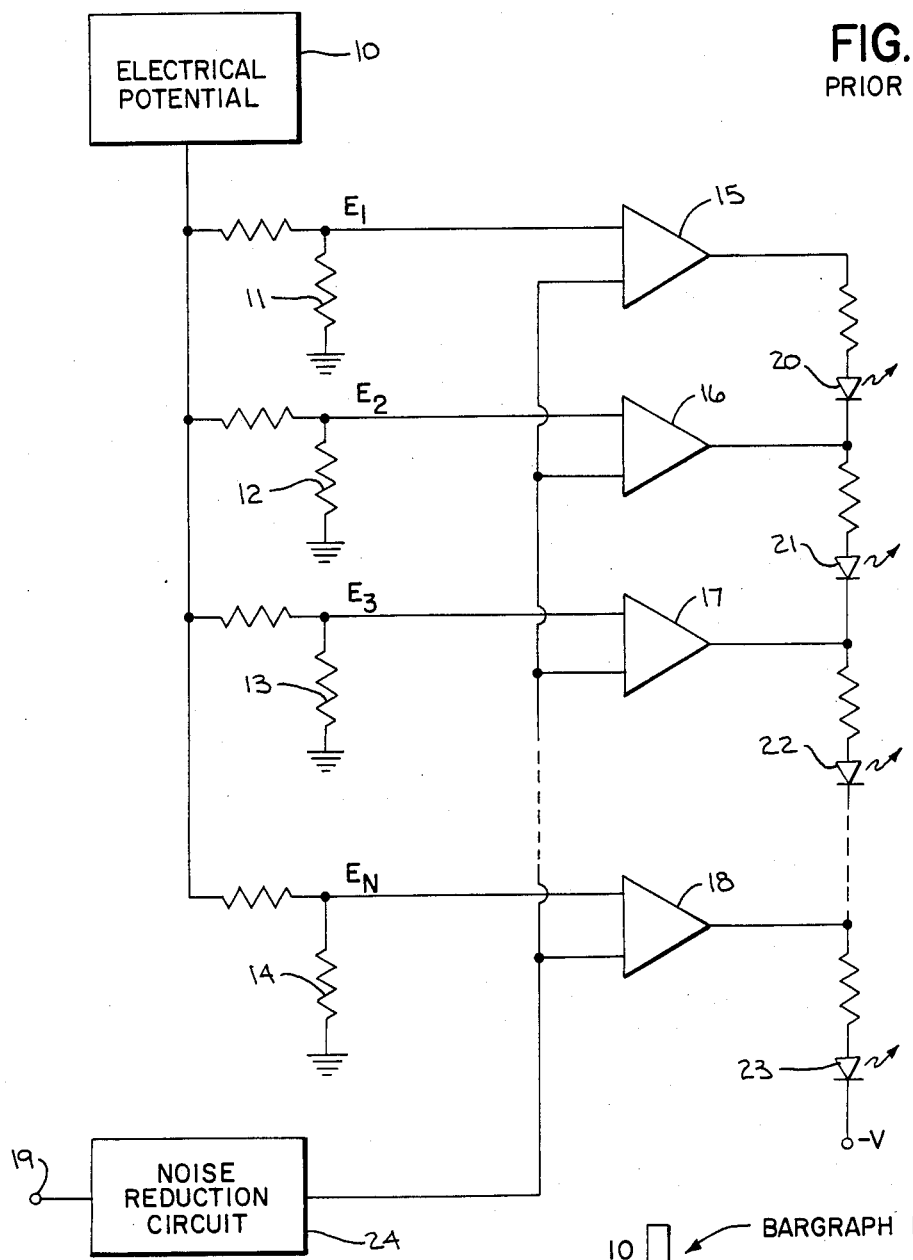
FIG. 5 is a circuit diagram of a typical control or driver circuit for a bargraph type LED display.

In FIG. 5 there have been shown the details of a typical control or driver circuit 27 for the bargraph display as could be used in carrying out the present invention, this detailed circuit corresponding to that illustrated in FIG. 1 of U.S. Pat. No. 4,056,412 to Campbell et al issued Feb. 1, 1977. The reference numerals used in FIG. 5 hereof are similar to those given in this reference patent except that the numerals have been prefaced by the digit "5". While the circuit shown in FIG. 5 is representative, it should be emphasized that driver circuits of different kind could also be used.

In FIG. 5 the light emitting diodes forming the bargraph display are designated as 520 to 523. These diodes, ten in number, are controlled by so-called "window comparators" 515 to 518, the outputs of which, generally speaking, are connected to the junction between the corresponding two adjacent light emitting diodes. Each of these comparators has two inputs, the first of these inputs being connected, in the embodiment shown in the reference patent through a noisereduction circuit 524, to the varying analog signal to be detected, the latter being connected at terminal 519. Each of the ten comparators, in addition, has a second input which in each case is connected to the "tap" point of an associated voltage divider 511 to 514. Each of these voltage dividers is connected at one end to ground and at the other end to an electrical potential 510. The voltages, E1 to E10, respectively, supplied by these voltage dividers to the second inputs of their respective comparators are incrementally graduated in amplitude. In the example described in the reference patent, these voltages, E1 to E10, are assumed to be spaced from each other by one volt, that is E1=1 volt, E2=2 volts, E3=3 volts, etc. Potential source 510 has a voltage of, for example, 100 volts. The voltage $-V$ to which the cathode of the last LED 523 is connected is assumed to be 15 volts.

The window-type comparators are arranged to provide a negative output of, say 15 volts, under normal conditions, that is when the incoming analog signal at terminal 519 does not exceed the reference voltage E1, E2, etc., at the reference input of a given comparator. On the other hand, if the received analog voltage does exceed the voltage at the associated reference input, then the comparator in question will produce an output of $+15$ volts.

Therefore, assuming that the received analog signal at 519 has a voltage of 2.5 volts, then it will be seen that the first comparator 515, whose reference voltage is E1=1 volt, will produce a 15-volt positive output and that, similarly comparator 516, the reference input of which is E2=2 volts, will also produce a positive voltage of 15 volts. Since the outputs of adjacent comparators 515 and 516 are thus the same, LED 520 will not be illuminated. However, in the assumed case of the received analog signal being 2.5 volts, the third comparator 517 which has a reference input of 3 volts will generate a negative output of 15 volts and for this reason the LED 521, which is connected between the outputs of comparators 516 and 517, will receive a positive +15 volt potential on its anode side and a −15 volt potential on its cathode side. Consequently, this second LED, 521, will be lit and, in fact, this LED will be the only one in the array of ten LEDs which is illuminated.

Bargraph instruments with a driver circuit of the type in which the individual LEDs of the array are progressively illuminated in one-by-one fashion are commercially available, compare for example catalog CAT 84, page 29, of National Semiconductor Corporation. Usually the bargraph instruments which are available on the market can be optionally arranged either for this one-by-one type of operation or for cumulative operation. While one-by-one operation is preferred in the case of the present invention, the cumulative alternative could also be used.

Figure 6:
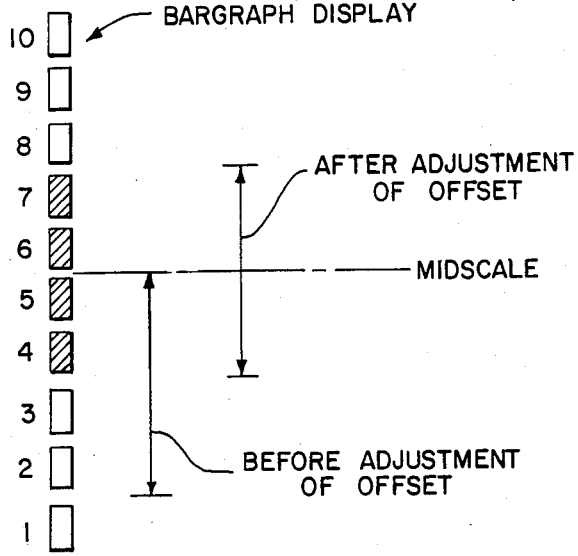
FIG. 6 is a schematic representation of the bar graph display, which illustrates the centering of the range of light variation about the midscale point of the bargraph display.

In FIG. 6 the bargraph display, designated as "2" in FIGS. 1 and 3, and as "2'" in FIG. 2, has been illustrated at a somewhat larger scale, with the indicia 1 to 10 shown against the individual LEDs. Underlying the showing of FIG. 6 is the case, mentioned above, in which the variations of the received analog signal occur at a rapid rate so that the LEDs in the received contrast range, that is in the present instance, between the maximum or "light" value of 7 volts and the minimum or "dark" value of 4 volts, are dimly illuminated, as indicated by a shading of the corresponding four diodes, 4 to 7, in this range. In FIG. 6 it has been assumed that the offset adjustment has already been carried out so that, this range from 4 to 7 is indeed centered with respect to the 10-volt scale of the instrument. Ordinarily, however, this will not be the case, for example the range of the received analog signal may originally extend between 2 and 5 volts as indicated by the double arrow marked "before adjustment of offset" in FIG. 6. By means of a corresponding adjustment of the offset, the displayed range can then be moved to the location of the double arrow marked "after adjustment of offset" which spans the midscale point of the instrument by equal amounts (2 volts) on both sides. If the gain needs adjustment to provide for a range of the most desirable amount which also allows for drift, then such an adjustment can also be made by manually varying the gain control 4 in FIG. 1. Since in the preferred embodiments described herein, the bargraph display is located immediately adjacent to the manual controls, it will be appreciated that the invention provides a scanning or sensing unit in which the adjustment is considerably enhanced as compared with the prior art.

In conclusion, it should be pointed out that the invention has been described herein merely by way of exemplary embodiments which however are susceptible of many modifications. For example, while the visual display has been shown herein as an array of rectangular bars, it is equally possible to use dots instead of bars. Also, while the driver circuit shown herein has been assumed to provide a linear display, the instrument could also be made to work in a logarithm mode or, if desired, even in a "VU - meter" mode. The above-referenced instrument, catalog CAT84, as marketed by National Semiconductor Corporation is designed to optionally provide any of these modes.

What is claimed is:

1. In a photoelectric sensing system of the type which has a light transmitting device and a photoelectric light receiving device providing an electrical output; in which the intensity of the light received by said light receiving device undergoes variations in accordance with the presence or condition of an object or objects in the light path between said light transmitting device and said light receiving device; and in which an electronic processing circuit is connected to said output, producing from said output an electric analog signal which is a function of said light variations and hence permits the presence or condition of said object or objects in said light path to be detected,
   a contrast indicating arrangement including a control circuit connected to said electronic processing circuit and a bargraph display in the form of an array of light emitting diodes connected to said control circuit,
   said control circuit successively illuminating said light emitting diodes in instantaneous response to the strength of said analog signal,
   so that both the maximum light intensity and the minimum light intensity detected by said photoelectric light receiving device, which between them determine the available range of light variation, can be read off said bargraph display during the photoelectric sensing operation.

2. In a photoelectric sensing system of the type which has a light transmitting device and a photoelectric light receiving device providing an electrical output; in which the light received by said light receiving device undergoes variations, as between a high light intensity and low light intensity, at a rapid rate in accordance with the presence of condition of an object or objects in the light path between said light transmitting device objects in the light path between said light transmitting device and said light receiving device; and in which an electronic processing circuit is connected to said output, producing from said output an electric analog signal which is a function of said light variations and hence permits the presence or condition of said object or objects in said light path to be detected,
   a contrast indicating arrangement including a control circuit connected to said electronic processing circuit and a bargraph display in the form of an array of light emitting diodes connected to said control circuit, said control circuit selectively and incrementally illuminating different ones of said light emitting diodes in instantaneous response to the strength of the analog signal,
   so that both the high light intensity and the low light intensity detected by the photelectric light receiving device, which between them determine the available range of light variation can be read off said visual display during the photoelectric sensing operation in terms of the range of diodes which are dimly illuminated due to the rapid transition of the analog signal between the corresponding two extremes.

3. A photoelectric object-sensing unit comprising,
   optical means for receiving a light beam which is high frequency modulated and the intensity of which also undergoes variations in accordance with the presence or condition of an object or objects in the path of said light beam,
   photoelectric receiving means for providing from the light beam passed by said optical means a high frequency modulated electrical output,
   an electronic processing circuit for high-frequency demodulating said output and producing therefrom an analog DC signal which is substantially proportional to said light variations and hence permits the presence or condition of said object or objects in said light path to be detected,
   control means for manually adjusting said electronic processing circuit, and
   contrast indicating means including,
       on the front of said unit a visual display in the form of an array of light emitting diodes, and
       an electronic control circuit for said visual display, said electronic control circuit being connected to said electronic processing circuit for selectively controlling said light omitting diodes so as to selectively illuminate said diodes instantaneous response to variations in the strength of the analog DC signal received from the electronic processing circuit, such that the detected maximum light intensity and the detected minimum light intensity, which between them determine the available range of light variation, can be read off said visual display, and said manually adjustable control means correspondingly set, during the photoelectric sensing operation.

4. A photoelectric sensing unit as claimed in claim 3, wherein said manually adjustable control means and said visual display are mounted on said unit adjacent to each other.

5. A photoelectronic sensing unit as claimed in claim 3, wherein said unit also comprises electronic light beam generating means and optical means for transmitting the beam generated by said light generating means.

6. A photoelectric sensing unit as claimed in claim 5, wherein said optical light beam transmitting means and said optical light beam receiving means together form an assembly which is detachably and interchangeably mounted on said unit.

7. A photoelectric sensing unit as claimed in claim 6, wherein said light beam generating means includes a high frequency modulator and said electronic processing circuit includes a corresponding demodulator, the modulation of said light beam serving to substantially eliminate the effect of ambient light.

8. A photoelectric sensing unit as claimed in claim 3, wherein said electronic processing circuit includes amplifying means and wherein said manual adjusting means includes a manual offset control for adjusting the bias of said amplifying means, thereby to center the light intensity variation range indicated by said visual display with respect to the scale of said display.

9. A photoelectric sensing unit as claimed in claim 8, wherein said manual adjusting means also includes a control for adjusting the gain of said amplifying means.

10. A photoelectric sensing unit as claimed in claim 3, wherein there is also provided a digital switching circuit and a voltage comparator means having two inputs and one output, said output being connected to the digital switching circuit, one of said inputs being connected to said electronic processing circuit and having the analog signal supplied by said electronic processing circuit impressed thereon, and the other input being connected to a reference voltage.

* * * * *